United States Patent [19]

Kohler et al.

[11] Patent Number: 5,143,288
[45] Date of Patent: Sep. 1, 1992

[54] COMPRESSED GAS AEROSOL SPRAY SYSTEM WITH A DIP TUBE VAPOR TAP HOLE

[75] Inventors: Karl A. Kohler; Frank M. Bado; Richard E. Krueger, all of Racine, Wis.

[73] Assignee: S. C. Johnson & Son, Inc., Racine, Wis.

[21] Appl. No.: 655,038

[22] Filed: Feb. 14, 1991

[51] Int. Cl.$^5$ .......................... B05B 7/32; B65D 83/32
[52] U.S. Cl. ........................................ 239/1; 239/337; 239/372; 222/402.18; 222/464; 222/635
[58] Field of Search ............... 239/337, 340, 344, 349, 239/354, 364, 368, 372, 1; 222/464, 402.18, 402.19, 635

[56] References Cited

U.S. PATENT DOCUMENTS

| | | | |
|---|---|---|---|
| 1,938,036 | 12/1933 | Martin et al. | 222/402.18 |
| 1,991,720 | 2/1935 | Barreda et al. | 222/464 |
| 2,183,639 | 12/1939 | Burdick et al. | 239/344 |
| 2,351,376 | 6/1944 | Ward | 239/372 |
| 2,400,955 | 5/1946 | Samel | 141/20 |
| 2,768,771 | 10/1956 | Beutel | 222/464 |
| 3,129,855 | 4/1964 | Malakoff et al. | 222/464 |
| 3,137,416 | 6/1964 | Shepherd et al. | 222/394 |
| 3,178,075 | 4/1965 | Riedl et al. | 222/386.5 |
| 3,184,118 | 5/1965 | Webster | 222/464 |
| 3,194,450 | 7/1965 | Van Brocklin | 222/464 |
| 3,211,349 | 10/1965 | Prussin et al. | 222/464 |
| 3,237,923 | 3/1966 | Turner, Jr. | 141/20 |
| 3,257,036 | 6/1966 | Micallef | 222/464 |
| 3,260,421 | 7/1966 | Rabussier | 222/464 |
| 3,544,258 | 12/1970 | Presant et al. | 222/402.18 |
| 3,656,657 | 4/1972 | Smith et al. | 222/464 |
| 3,785,537 | 1/1974 | Appleby et al. | 222/464 |
| 3,801,015 | 4/1974 | Hayes | 239/372 |
| 4,159,790 | 7/1979 | Bailey | 222/464 |
| 4,162,765 | 7/1979 | Riccio | 239/337 |
| 4,398,654 | 8/1983 | Pong et al. | 222/464 |
| 4,418,846 | 12/1983 | Pong et al. | 222/464 |
| 4,530,450 | 7/1985 | Nadagiri | 222/464 |
| 4,546,905 | 10/1985 | Nandagiri et al. | 222/464 |
| 4,572,406 | 2/1986 | Pratt et al. | 222/464 |
| 4,611,641 | 9/1986 | Carter, Sr. | 141/4 |
| 4,935,224 | 6/1990 | Russo et al. | 424/47 |
| 5,048,721 | 9/1991 | Gittens et al. | 222/1 |

*Primary Examiner*—Andres Kashnikow
*Assistant Examiner*—Karen B. Merritt

[57] ABSTRACT

Apparatus and method for using a compressed gas in an aerosol spray system to produce and maintain an effective aerosol spray includes the use of an aerosol spray valve 4 for emitting the aerosol spray. A dip tube 18 is coupled to the valve 4 and extends into the spray system. The tube 18 has an upper portion which is substantially airtight above an initial liquid level 14. A lower portion of the dip tube 18 extends below the initial liquid level 14 and has a liquid entrance hole 24 substantially at the bottom thereof. A vapor tap hole 26 is provided in the dip tube 18 above the liquid entrance hole 24 and below the initial liquid level 14. The vapor tap hole 26 allows compressed gas 16 to enter the tube 18 and mix with the liquid 20 therein when the liquid level 28 has fallen below the vapor tap hole. Even after the pressure has fallen, the mixing of the compressed gas 16 with the liquid 20 in the dip tube 18 substantially reestablishes the deteriorated spray characteristics to produce an effective aerosol spray.

18 Claims, 2 Drawing Sheets

COMPRESSED GAS AEROSOL SPRAY SYSTEM WITH A DIP TUBE VAPOR TAP HOLE

BACKGROUND OF THE INVENTION

The present invention relates to a compressed gas aerosol spray system which conserves gas yet retains effective spray characteristics by disposing a vapor tap hole in the dip tube below the initial liquid level.

Aerosol spray systems have achieved a large presence in the market place due to their ease of application and the wide variety of products which can be applied via airborne particles. For example, furniture polishes, air fresheners, insecticides, paints, deodorants, etc. can be readily and effectively applied using an aerosol spray system. As is known, aerosol spray systems for such products use hydrocarbon propellants to great advantage. Specifically, these propellants are liquefiable and may be maintained in the aerosol spray container in both the liquid and gaseous states. As the liquid product is emptied from the container, more of the propellant vaporizes, thus retaining relatively high pressure within the container to ensure that the desirable spray characteristics remain relatively constant until the container is emptied. However, such hydrocarbon propellants can produce by-products which are detrimental to the environment and are flammable.

The use of a compressed gas such as nitrogen or air to charge an aerosol spray device would effectively overcome the possible problems inherent in the use of hydrocarbon propellants in that they are safe and nonflammable. However, such compressed gases are not readily liquefiable. Therefore, the pressure within the container is reduced as the liquid product is emptied therefrom. Without sufficient pressure inside the container, an effective aerosol spray cannot be achieved since the spray characteristics (such as spray cone angle, spray pattern shape, particle size, etc.) of the spray will deteriorate with falling pressure. This is because the aerosol spray is produced by mechanical breakup of the liquid at high pressures, for example, at 80-125 pounds per square inch ("psi") which is 0.552-0.862 MegaPascal ("MPa"). Below such pressures, anomalies such as increased particle size, streaming, reduced spray cone angle, etc. may occur, and the spray characteristics become unsatisfactory.

FIG. 1 depicts one potential problem of using compressed gas in a typical aerosol spray system. In such an aerosol spray system, for example, a mixture of 60% by volume liquid and 40% by volume compressed nitrogen may be pressurized in a container to e.g., 120 psi (0.827 MPa) and may initially produce a particle spray size of 50 microns. As shown by the continuous line in FIG. 1, as the liquid is emitted from the container, the pressure will drop and the particle size will tend to increase The intermittent line shows the condition of the prior art system wherein the particle size eventually may reach 90 microns at 80 psi (0.551 MPa) pressure within the container. At that point the spray characteristics will deteriorate and the spray may become much heavier with large-sized droplets. It can be readily seen that when the pressure in the container is eventually reduced to approximately 20 psi (0.138 MPa), a mere stream of liquid may be emitted from the valve. Thus, the system no longer produces an aerosol spray and is not effective for its intended use. This problem becomes extreme for products such as air fresheners which require a maximum of a 30-50 micron particle size to keep the particles airborne.

This problem cannot be solved by merely increasing the initial pressure within the spray can to 150 psi (1.03 MPa) or greater. A can sturdy enough to withstand such a high initial pressure would also be very heavy, cumbersome to use, and expensive. Furthermore, federal and local transportation regulations limit the amount of pressure for a given container. For example, the U.S. Department of Transportation requires that common aerosol spray cans not exceed pressures of 140 psi (0.965 MPa) at 130° F. (54.4° C.). Therefore, although compressed gas appears to be a good propellant in terms of minimizing damage to the environment, its properties are not well suited for typical aerosol spray cans.

The prior art is replete with structures for emitting various combinations of fluid and gas in an aerosol spray. For example, U.S. Pat. No. 3,260,421 to Rabussier discloses a dispensing device for aerosol pressure containers intended for properly mixing and spraying two immiscible liquids. The push-button valve allows pressurized liquids to enter a plurality of holes in the dip tube and be emitted from the container. The dip tube holes are disposed through both of the liquid phases so that both of the liquids enter the tube and are mixed together therein. To enhance mixing, the push-button valve has a vapor tap orifice leading to the gas volume within the container. Pressurized gas enters the valve through this vapor tap orifice and enhances the mixing and mechanical breakup of the liquids in the valve. A problem with this structure is that pressure is lost because of the vapor tap orifice in the valve. In addition, dip tube holes are also disposed above the liquid level, thus allowing another escape path for the gas.

U.S. Pat. No. 3,184,118 to Webster discloses a aerosol spray container for mixing paint, in which the dip tube has a plurality of small holes in the bottom thereof to screen out large debris which may clog up the valve. However, if compressed gas were used in the container of Webster, the gradual reduction in pressure would result in a liquid paint stream being emitted rather than a paint spray.

U.S. Pat. No. 3,656,657 to Smith et al. discloses apparatus for dispensing fluid mixtures in uniform proportions from pressure containers. The bottom of the dip tube is closed but a liquid entrance hole is located adjacent the closed end. At least one hole is provided in the dip tube below the liquid level, and the container is pressurized to approximately 345 psi (2.38 MPa). Smith et al. does not disclose a specific valve mechanism. Further, it should be appreciated that such large internal pressures would be totally inappropriate for the consumer aerosol spray market.

U.S. Pat. No. 3,129,855 to Malakoff et al. discloses an aerosol package which provides an emergency reserve of sprayable liquid material. When the level of the liquid in the container falls below the level of the openings in the dip tube, only gas is discharged. The user then tips the aerosol container to gain access to the reserve liquid. Again, if compressed gas were utilized in this aerosol package, the decrease in pressure would produce a very large particle size.

Thus, it is an object of this invention to provide an aerosol spray system using compressed gas but which provides satisfactory spray characteristics after partial discharge to achieve a safe, environmentally benign, reliable aerosol spray.

SUMMARY OF THE INVENTION

The present invention solves the disadvantages of known aerosol spray systems by utilizing a vapor tap hole disposed in the dip tube below the initial liquid level in the spray container. Initially, effective spray characteristics are achieved by mechanical breakup of the liquid due to the high initial pressure within the container. As the liquid level falls, the internal gas pressure is reduced beyond certain limits and the spray characteristics such as particle size, spray pattern, and cone angle gradually deteriorate. When the liquid level reaches the vapor tap hole in the dip tube, compressed gas enters the dip tube and mixes therein with the liquid in order to aerate the pressurized liquid within the dip tube, thus restoring the spray characteristics. Deterioration of the spray characteristics is overcome due to the mixing of the compressed gas with the liquid within the dip tube. Accordingly, compressed gas is metered into the dip tube through the vapor tap hole as it is needed. Therefore, the compressed gas is conserved since there are no orifices in the dispensing valve or in the dip tube above the initial liquid level.

In accordance with one aspect of the present invention, aerosol spray apparatus for use in a compressed-gas aerosol spray system includes an aerosol spray valve for emitting an aerosol spray. A dip tube is coupled to the valve and extends downward into the spray system. The tube has an upper portion having a continuous outer surface above an initial liquid level in the spray system, and a lower portion of the dip tube extends below the initial liquid level. The lower portion of the dip tube has a liquid entrance hole and a vapor tap hole disposed above the liquid entrance hole. The vapor tap hole allows compressed gas to enter the tube and mix with the liquid therein when the liquid level is below the vapor tap hole in order to substantially reestablish effective aerosol spray characteristics, for example a predetermined particle size and/or cone angle.

According to a further aspect of the present invention, an aerosol spray system for using a compressed gas to produce and maintain an effective aerosol spray includes a container for holding a liquid and the compressed gas under a predetermined pressure. An aerosol spray valve is coupled to a top of the container and has an exit orifice for emitting the aerosol spray. A dip tube is coupled to the valve and extends through the compressed gas and into the liquid toward a bottom of the container. The portion of the dip tube which extends above the initial liquid level is substantially airtight. A vapor tap hole is provided in the dip tube, below the initial liquid level, for allowing compressed gas to enter the dip tube when the initial liquid level has fallen to a predetermined level to cause the aerosol spray characteristics to be substantially renewed.

According to a further aspect of the present invention, a method is provided for augmenting an aerosol spray in a compressed gas aerosol spray system, which system includes (i) a liquid and a compressed gas in a pressurized container, (ii) an aerosol spray valve for emitting an aerosol spray, (iii) a dip tube to access said liquid, coupled to said spray valve and extending into said liquid, said dip tube having an upper portion above an initial liquid level and a lower portion below the initial liquid level, said lower portion having a liquid entrance hole. The method includes the steps of (a) providing a fluid communication between said compressed gas in the container and the liquid in said dip tube through a vapor tap hole in said dip tube, said vapor tap hole spaced above said liquid entrance hole and below the initial liquid level in the container, and (b) augmenting such aerosol spray by renewing the spray characteristics when the liquid level in the container is below the vapor tap hole by admitting a portion of said compressed gas into said dip tube through said vapor tap hole to admix with the liquid in the dip tube and to reestablish effective spray characteristics of the aerosol spray.

BRIEF DESCRIPTION OF THE DRAWINGS

The advantageous structure and functions according to the present invention will be readily apparent from the following detailed description of the preferred embodiment taken in conjunction with the appended drawings in which.

DETAILED DESCRIPTION OF THE PREFERRED EMBODIMENT

Figure 2:
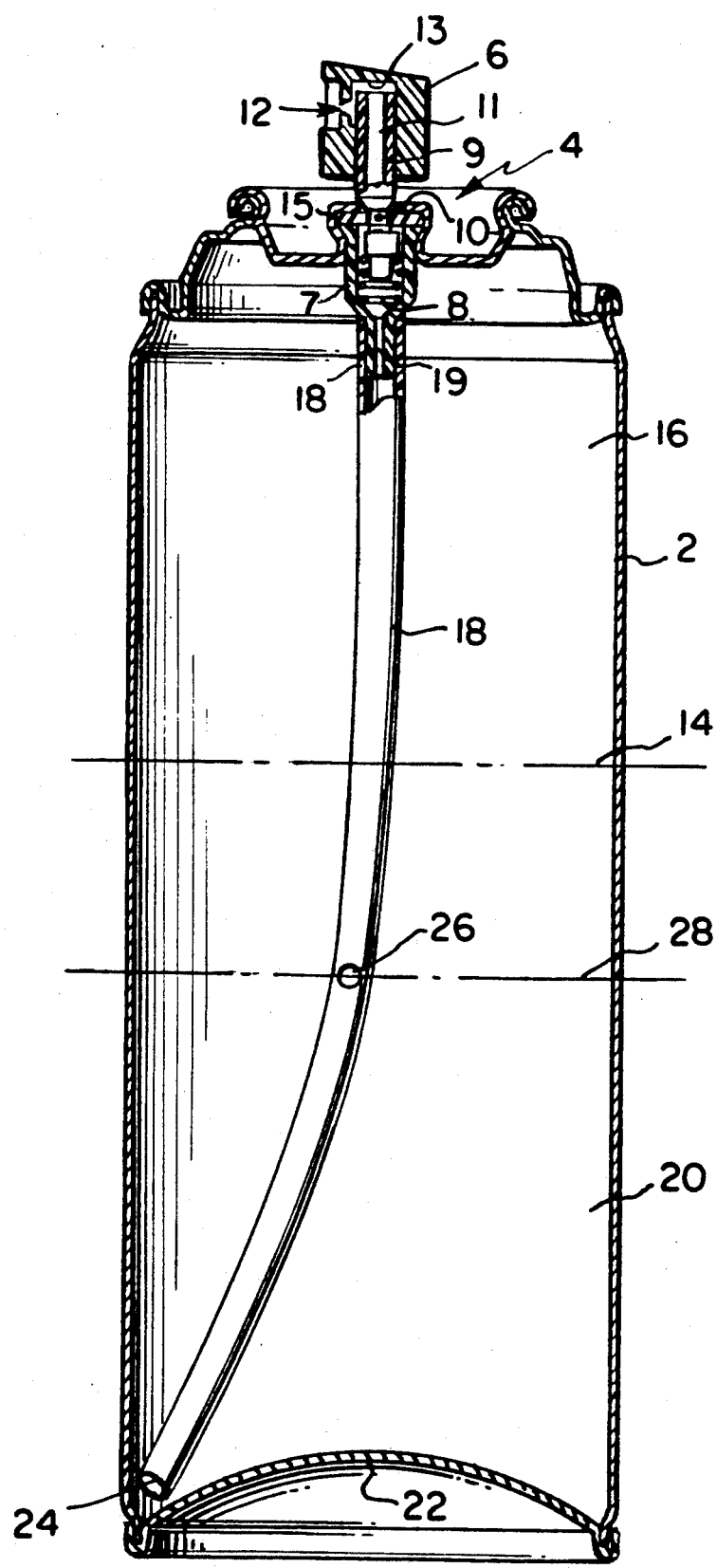
FIG. 2 is a partial cross-sectional view of a preferred embodiment of the present invention.

A preferred embodiment is shown in FIG. 2 which is a partial cross-sectional view of an aerosol spray system utilizing the features of the present invention. The container 2 comprises a well-known metal aerosol spray can capable of being pressurized up to about 140 psi (0.965 MPa) at 130° F. (54.4° C.). A valve member 4 is coupled to the top of container 2 and crimped therein in a well-known manner. Valve member 4 includes such known structures as push-button actuator 6, valve body 7, spring 8, valve stem 9, stem orifice 10 which opens into valve stem passage 11, button exit orifice 12, button passage 13, sealing gasket 15, diptube 18, and tail orifice 19. Actuator 6 closely fits over valve stem 9 such that passage 13 provides communication between valve stem passage 11 and exit orifice 12. Likewise, valve stem passage 11 communicates with dip tube 18 through stem orifice 10 and tail orifice 19. The valve 4 of the present invention is an aerosol spray valve or non-vapor-tap valve. When actuator 6 is pressed down, valve stem orifice 10 is pushed below sealing gasket 15 to permit liquid 20 to pass through valve stem orifice 10, valve stem passage 11, button passage 13 and out exit orifice 12. There is no orifice in the valve body 7 of valve 4 through which compressed gas 16 within the headspace of container 2 can pass. Thus, initially, the breakup of the liquid 20 exiting the exit orifice 12 is caused by the initial high pressure within the container 2. In general, the size of the exit orifice 12 will depend upon, inter alia, the amount of pressurization, the viscosity of the liquid, the diameters of the dip tube and the other orifices and passages present in the valve, the spray characteristics desired and the like. For most purposes the size of the exit orifice 12 is from 0.005 to 0.100 inch ('''') (0.0127 to 0.25 cm). The exit orifice 12 is preferably larger than the vapor tap hole 26 and smaller than the internal diameter of the dip tube 18.

As used in the specification and claims, the term "spray characteristics" represents those features predetermined to be desirable in a particular spray. These features may vary somewhat with respect to a particular fluid to be sprayed. For example, high-viscosity fluid will display a reduced cone angle when the initial pressure falls. A low-viscosity fluid may display greater particle size and an altered spray pattern shape when the pressure is reduced. Therefore, "spray characteristics" denote desirable features for a particular sprayed fluid. Such spray characteristics include, but are not limited to, the spray cone angle, the spray pattern shape, the spray particle size, the spray discharge rate, the spray particle dispersion (particles/cubic inch), the spray velocity, etc. Poor spray characteristics result from spray "streaming" (where the spray becomes a liquid stream or streams), insufficient terminal pressure, irregular spraying over time, etc. Most fluids used within the spray system according to the present invention will experience renewed or reestablished spray characteristics when the liquid level falls below the vapor tap hole 26 allowing the compressed gas to aerate the liquid within the tube 18.

Within container 2, the headspace above the initial liquid level 14 is charged with compressed gas 16. The compressed gas 16 includes any usable gas which is environmentally safe and preferably nonliquefiable at room temperatures ($\approx 25°$ C.) and nonflammable. The compressed gas 16 typically includes argon, carbon dioxide, air, oxygen, helium, nitrogen, nitrous oxide, or any combination thereof.

The compressed gas 16 may be suitably charged to an initial pressure of 120 psi (0.827 MPa). It is known that mechanical breakup of the liquid 20 exiting the exit orifice 12 will occur at pressure values between substantially 80-125 psi (0.552-0.862 MPa) for most products of commercial interest.

A dip tube 18 is coupled to the valve 4 and extends through the portion of the container 2 holding the compressed gas 16 and into the liquid 20 to a bottom 22 of the container 2. The dip tube 18 has a liquid entrance hole 24 at the bottom thereof for delivering liquid from the bottom of container 2 to the valve 4.

The dip tube 18 is formed by any known and useful material conventionally utilized heretofore. Preferably, the dip tube 18 is made of polypropylene, polyethylene, or other plastics, rubber, or the like.

The dip tube 18 is a hollow cylinder having an inner diameter large enough to pass the liquid 20 without substantial clogging The range of internal diameters for the dip tube 18 will depend upon, inter alia, the identity of the liquid 20 being dispensed, the identity of the compressed gas 16, the internal pressure of the container 2, the orifice size of the valve 4 and the like. The dip tube 18 preferably has an inner diameter of from 0.04" to 0.25" (0.10 cm to 0.635 cm).

A vapor tap hole 26 is formed in the dip tube 18 below the initial liquid level 14 and above the liquid entrance hole 24. The vapor tap hole 26 is preferably smaller than the liquid entrance hole 24 and exit orifice 12. The particular diameter of the vapor tap hole 26 will depend upon, inter alia, the liquid 20 being dispensed, the internal pressure, the orifices present in the valve 4, and the size of the entrance hole 24 of the dip tube. For most purposes the vapor tap hole 26 is preferably from 0.002" to 0.030" (0.005 cm to 0.076 cm), more preferably from 0.008" to 0.015" (0.020 cm to 0.038 cm).

As the liquid 20 within container 2 falls to a liquid level 28, the vapor tap hole 26 is exposed allowing compressed gas 16 to enter the dip tube 18. In the dip tube 18, the compressed gas 16 mixes with the liquid 20. When the mixture of compressed gas 16 and liquid 20 is sprayed, the pressure of the compressed gas 16 will reestablish effective spray characteristics. For example, in a high viscosity liquid, the particle size of the spray droplets will be reduced. Therefore, even though the pressure within the container 2 is reduced after use, desired spray characteristics may be achieved by disposing a vapor tap hole 26 below the initial liquid level 14.

The exact location of vapor tap hole 26 will vary depending upon, inter alia, the liquid product to be used, the desired spray characteristics, and the pressure of the compressed gas 16. A preferred range for the location of the vapor tap hole 26 is from substantially 10 percent below the initial liquid level 14 to substantially 95 percent below the initial liquid level 14. Taken another way, if the initial liquid level 14 is 100 units from the entrance hole 24, the vapor tap hole 26 is placed from 10 units from the initial liquid level 14 to 95 units from the initial liquid level 14. For most purposes, the vapor tap hole 26 is 40 percent or more below the initial liquid level 14.

As noted above, the vapor tap hole 26 is preferably smaller than both the liquid entrance hole 24 and the exit orifice 12. This will permit a metered injection of the compressed gas 16 into the liquid 20 passing through the dip tube 18 throughout the effective life of the product.

Also as noted above, the vapor tap hole 26 is usually located so as to become effective when the liquid level has fallen to a predetermined level. The vapor tap hole 26 is of appropriate size and is so positioned to provide a terminal container pressure of at least one-fourth, and more preferably, one-third of the predetermined initial pressure. As noted above, the desired spray characteristics, the type of liquid 20, and the initial pressure in the container 2 will determine the exact location and dimensions of the vapor tap hole 26.

Figure 1:
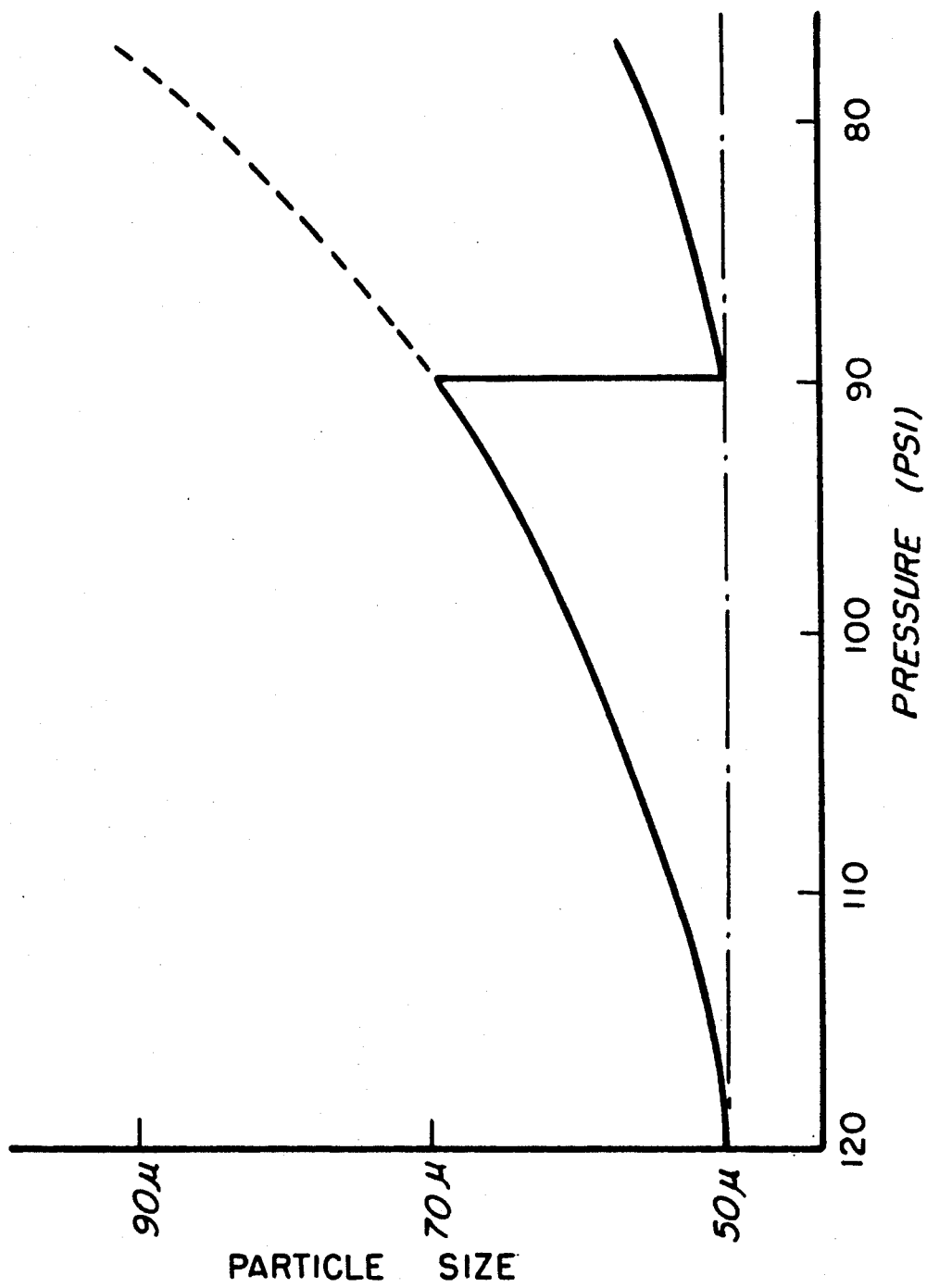
FIG. 1 is a graph depicting the relationship between pressure and one spray characteristic, e.g., particle size, according to the prior art and in the subject invention respectively.

FIG. 1 graphically illustrates an example of the advantageous results which can be achieved by the structure according to the present invention. If a conventional aerosol spray can is filled with 60% by volume liquid and 40% by volume compressed gas and charged to 120 psi (0.827 MPa), initially an aerosol spray particle size in the range of 50 microns can be produced by the mechanical breakup of the liquid, given predetermined liquid viscosity and surface tension characteristics. Gradually, as liquid is removed from the can, the pressure will decrease producing a corresponding increase in the particle size. At an internal pressure of approximately 90 psi (0.621 MPa), the particle size may be on the order of 70 microns, thus producing a slightly degraded spray performance. Where the particle size continues to grow with the increasing pressure drop, deteriorated spray characteristics (including an ineffective particle size) are eventually produced, as depicted by the dash line.

To prevent such an increase in spray particle size, a vapor tap hole 26 is positioned in the dip tube. The compressed gas 16 is introduced into the dip tube 18 and will reestablish the desired smaller particle size at approximately 90 psi (0.621 MPa). As the internal pressure continues to drop, the particle size will again gradually increase. However, throughout a broad pressure range, usually from 40 to 120 psi (0.276 to 0.827 MPa), effective, controlled aerosol spray characteristics can usually be maintained.

The following examples are illustrative only. All pressures given in the following examples are gauge pressure values.

EXAMPLE I

A standard 202×509 aerosol spray can (5 9/16 inches high at the can side) was filled with 60% by volume with furniture polish (158 grams of Prontox TM type furnish polish) and 40% by volume compressed nitrogen at 123 psi (0.848 MPa) at room temperature. The spray can was formed as illustrated in FIG. 2. The tail orifice 19 diameter was 0.080" (0.203 cm), the valve stem orifice 10 diameter in the valve was 0.020" (0.051 cm), and the vapor tap hole 26 was 0.008" (0.020 cm) and placed 1.5" (3.8 cm) from the can bottom. The exit orifice 12 diameter was 0.0145" (0.037 cm). During a first 10 second spray discharge, the discharge rate was 2.33 g/sec and the pressure had fallen to 83 psi (0.572 MPa). During a second 10 second spray discharge, the discharge rate was 1.93 g/sec and the pressure had fallen to 73 psi (0.503 MPa). After a third ten second spray discharge, the pressure had fallen to 55 psi (0.379 MPa). Between the second and third discharges, the spray pattern deteriorated (reduced cone angle, increased particle size, streaming, etc.), and became unacceptable. Spraying was then continued, and as the vapor tap hole became exposed to the compressed gas in the headspace, the spray pattern improved dramatically, i.e., the cone angle increased, the particle size decreased, and the streaming was substantially eliminated. The container was then sprayed to exhaustion, and the terminal pressure was found to be 42 psi (0.290 MPa).

EXAMPLE II

The basic experiment of Example I was repeated only a different furniture polish (Lemon Pledge TM furniture polish) was used with an actuator having an exit orifice 12 diameter of 0.016" (0.041 cm). Again between the second and third discharges, the spray characteristics deteriorated and became unacceptable. Again, once the vapor tap hole became exposed to the compressed gas, the spray characteristics improved dramatically. In this example, terminal pressure was found to be 43 psi (0.296 MPa).

EXAMPLE III

The basic experiment of Example II was repeated only the vapor tap hole diameter was 0.012" (0.030 cm) and the actuator had an exit orifice 12 diameter of 0.0145" (0.037 cm). After a first ten second discharge at a rate of 2.32 g/sec, the pressure was found to be 96 psi (0.662 MPa). The unit was then sprayed until the spray characteristics became unacceptable, and the pressure was measured at 55 psi (0.379 MPa). The spray was then continued until the vapor tap hole was exposed to the compressed gas and the spray characteristics again became satisfactory. When the spray characteristics became satisfactory, the pressure was measured at 53 psi (0.365 MPa). The unit was then sprayed to exhaustion and terminal pressure was measured to be 43 psi (0.0296 MPa).

EXAMPLE IV

The basic experiment of Example III was repeated only the vapor tap hole was placed 2" (5.1 cm) up from the bottom of the dip tube. The unit was sprayed continuously with no discharge rates or pressures taken until the end. The spray patterns were generally acceptable throughout, but deterioration was noticed after about one third of the product had been sprayed from the container. When the vapor tap hole was exposed to the compressed gas, the spray characteristics noticeably improved and became more doughnut shaped. After exhaustion, the terminal pressure was measured to be 43 psi (0.0296 MPa).

In the following comparative Examples V-VIII, the basic experiment of Example I was repeated using conventional vapor tap valves.

EXAMPLE V

In Example V, the container used was fitted with a standard valve having a valve stem orifice 10 diameter of 0.018" (0.046 cm), a tail orifice 19 diameter of 0.080" (0.203 cm) and a vapor tap hole of diameter 0.006" (0.015 cm) was placed in valve body 7 so that it was in constant communication with compressed gas 16. No vapor tap hole was present in the dip tube. The exit orifice 12 diameter was 0.0145" (0.037 cm). As in Example I, the initial pressure at 40% container volume of nitrogen gas was 123 psi (0.848 MPa). During a first 10 second spray discharge, the discharge rate was 2.12 g/sec and the pressure had fallen to 95 psi (0.655 MPa). During the next 10 second spray discharge, the discharge rate was 1.87 g/sec and the pressure had fallen to 80 psi (0.552 MPa). After the third 10 second spray discharge, the discharge rate was 1.73 g/sec and the pressure had fallen to 68 psi (0.469 MPa). After the fourth 10 second spray discharge, the discharge rate was 1.59 g/sec and the pressure had fallen to 58 psi (0.400 MPa).

The container was then sprayed to exhaustion and the terminal pressure was found to be 30 psi (0.207 MPa). The spray characteristics were acceptable throughout the life of the container.

However, the terminal container pressure was only 24% of the original container pressure. Examples I-IV resulted in terminal pressures which were about one-third of the original pressure. Thus, an additional reserve of compressed gas was provided as added insurance that the container could be emptied of its contents, even if some of the gas pressure had been lost as a result of abuse such as by spraying the can upside down so only gas comes out of the container.

EXAMPLE VI

In Example VI, a terminal pressure of 33 psi (0.228 MPa) with acceptable spray characteristics through the life of the container was obtained when Example V was repeated as above starting with the same original pressure, but the valve had a 0.025" (0.064 cm) diameter valve stem orifice.

EXAMPLE VII

In Example VII, a terminal pressure of 33 psi (0.228 MPa) with acceptable spray characteristics throughout the life of the container was obtained when Example V was repeated as above starting with the same original pressure, but the valve had a 0.020" (0.051 cm) diameter valve stem orifice.

EXAMPLE VIII

In Example VIII, a terminal pressure of 35 psi (0.241 MPa) with acceptable spray characteristics throughout the life of the container was obtained when Example V was repeated as above starting with an original pressure of 125 psi (0.862 MPa), but the valve had a 0.020" (0.051 cm) diameter valve stem orifice and a 0.100" (0.254 cm) tail orifice diameter.

In the above experiments, all units used standard dip tubes and had a positive actuator to dip tube curvature orientation to insure maximum product delivery and minimize gas loss.

The above examples show that in the present invention the compressed gas is effectively conserved to provide a higher terminal pressure as a reserve of gas to insure the container can still be fully evacuated if some of the gas is lost through abuse. Furthermore, the compressed gas is efficiently utilized to assist in controlling the spray characteristics within a useful range.

Persons of ordinary skill in this field will appreciate that the desired spray characteristics will vary depending the type of fluid being sprayed. For example, surface application products such as furniture polish must have a large particle size so that the product drops to the furniture. However, the spray cone angle should be wide so that a relatively uniform layer of polish is applied to the furniture. This enhances furniture polishing by allowing an easier break-up of the emulsion and application of the new molecular coating during wiping. However, for products such as air freshener where it is desired to keep the particle airborne for a long period of time, particle size is more critical and must be much smaller. However, the spray pattern shape may not be so critical as with furniture polish. Also, the viscosity of these sprays is usually somewhat lower. Therefore, it can be readily appreciated that different desired spray characteristics are required for different liquid products. However, for all aerosol spray products, the use of a vapor tap hole as described herein is beneficial in reestablishing and renewing the desired spray characteristics when the vapor tap hole becomes exposed to the compressed gas within the container.

Thus, what has been described is a structure and method for producing and maintaining effective spray characteristics in a compressed gas aerosol spray system. Those of ordinary skill in this field will readily appreciate the ease with which the above-described structure can be manufactured. Mechanical or laser drilling of the vapor tap hole 26 can be easily carried out, and spray valves, dip tubes, and aerosol spray containers are conventional off-the-shelf items. Therefore, utilizing available technology, the present invention achieves a safe and effective aerosol spray system.

Those of ordinary skill in this field will readily understand that modifications to the structure and functions described herein may be made without departing from the spirit or scope of the appended claims. For example, the compressed gas may include a small or moderate amount of liquefiable propellant, depending upon the product to be sprayed and the environment within which it will be used. Further, a plurality of vapor tap holes may be positioned on the dip tube in order to achieve additional mixing of the compressed gas with the liquid within the dip tube when the container liquid level is low. Again, the product to be sprayed and the environment in which the spray is to be applied will dictate the exact embodiments to be used. Nevertheless, it should be understood that all equivalent structures and methods are to be included within the spirit and scope of the appended claims.

What is claimed is:

1. Aerosol spray apparatus for use in a compressed-gas aerosol spray system, comprising:
   an aerosol spray valve containing an actuator having an exit orifice for emitting an aerosol spray; and
   a dip tube coupled to said valve and extending into the spray system, said tube having (a) an upper portion having a continuous outer surface above an initial liquid level in the spray system, and (b) a lower portion extending below the initial liquid level, said lower portion having a liquid entrance hole and a vapor tap hole above said liquid entrance hole, said vapor tap hole allowing compressed gas to enter said tube and mix with the liquid within the tube when the liquid level is lower than said vapor tap hole to substantially renew spray characteristics of the aerosol spray.

2. Apparatus according to claim 1, wherein the vapor tap hole has a diameter less than the diameter of the exit orifice and the internal diameter of the dip tube.

3. Apparatus according to claim 2, wherein said vapor tap hole has a diameter from 0.002" to 0.030" (0.005 cm to 0.076 cm).

4. Apparatus according to claim 1, wherein said aerosol spray valve has an exit orifice substantially larger in diameter than said vapor tap hole and substantially smaller in diameter than the internal diameter of said dip tube.

5. Apparatus according to claim 4, where said aerosol spray valve has an exit orifice from 0.005" to 0.100" (0.0127 cm to 0.254 cm).

6. Apparatus according to claim 1, where said dip tube has an internal diameter from 0.04") to 0.25" (0.1 cm to 0.64 cm).

7. Apparatus according to claim 1, wherein the compressed gas is substantially non-liquefiable at room temperature.

8. Apparatus according to claim 1, wherein said vapor tap hole is positioned in said dip tube at a level substantially 10-90% below the initial liquid level.

9. Apparatus according to claim 1, wherein said spray characteristics include at least one of spray cone angle, spray particle size, spray pattern shape, and spray particle dispersion.

10. An aerosol spray system for using a compressed gas to produce and maintain an effective aerosol spray, comprising:
    a container for holding a liquid and the compressed gas under a predetermined pressure;
    an aerosol spray valve coupled to a top of said container and having an exit orifice for emitting the aerosol spray;
    a dip tube, coupled to said valve and extending through the compressed gas and into the liquid toward a bottom of said container, for delivering the liquid to the valve, a portion of said dip tube which extends above an initial liquid level being substantially airtight; and
    a vapor tap hole in said dip tube for allowing compressed gas to enter said dip tube when the liquid level reaches a predetermined level below said initial liquid level, to cause spray characteristics of the aerosol spray to be substantially renewed.

11. A system according to claim 10, wherein said vapor tap hole is of a sufficient size and is spaced to produce a terminal container pressure which is at least equal to substantially one third of the predetermined pressure.

12. A system according to claim 10, wherein said dip tube has a liquid entrance hole at a bottom thereof, said liquid entrance hole being larger in diameter than said valve exit orifice and said vapor tap hole.

13. A system according to claim 10 wherein said compressed gas is selected from the group consisting of nitrogen, air, carbon dioxide, nitrous oxide, argon, helium, oxygen and mixtures thereof.

14. A method for augmenting an aerosol spray in a compressed gas aerosol spray system, which system includes (i) a liquid and a compressed gas in a pressurized container, (ii) an aerosol spray valve for emitting an aerosol spray, (iii) a dip tube to receive said liquid and coupled to said spray valve and extending into said liquid, said dip tube having an upper portion above an initial liquid level and a lower portion below the initial liquid level, said lower portion having a liquid entrance hole, which comprises the steps of:

(a) providing a fluid communication between said compressed gas in the container and the liquid in said dip tube through a vapor tap hole in said dip tube, said vapor tap hole spaced above said liquid entrance hole and below the initial liquid level in the container; and (b) augmenting said aerosol spray by renewing the spray characteristics thereof when the liquid level in the container is below the vapor tap hole by admitting a portion of said compressed gas into said dip tube through said vapor tap hole to admix with the liquid in the dip tube and to provide an effective aerosol spray.

15. The method of claim 14 including the step of employing a compressed gas selected from the group consisting of nitrogen, air, carbon dioxide, nitrous oxide, argon, helium, oxygen, and mixtures thereof.

16. The method of claim 14 including the step of maintaining air tight the upper portion of the dip tube.

17. The method of claim 14 wherein the spray characteristics include at least one of spray cone angle, spray particle size, spray pattern shape, and spray particle dispersion.

18. The method of claim 14 further including the step of positioning and dimensioning the vapor tap hole to cause a terminal container pressure to be at least equal to substantially one third of an initial container pressure.

* * * * *